(12) United States Patent
Dueber et al.

(10) Patent No.: US 7,220,490 B2
(45) Date of Patent: May 22, 2007

(54) POLYIMIDE BASED ADHESIVE COMPOSITIONS USEFUL IN FLEXIBLE CIRCUIT APPLICATIONS, AND COMPOSITIONS AND METHODS RELATING THERETO

(75) Inventors: Thomas E. Dueber, Wilmington, DE (US); Michael W. West, Wilmington, DE (US); Brian C. Auman, Pickerington, OH (US); Robert V. Kasowski, West Chester, PA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 390 days.

(21) Appl. No.: 10/892,863

(22) Filed: Jul. 16, 2004

(65) Prior Publication Data

US 2005/0143534 A1    Jun. 30, 2005

Related U.S. Application Data

(60) Provisional application No. 60/533,468, filed on Dec. 30, 2003.

(51) Int. Cl.
*B32B 9/04* (2006.01)

(52) U.S. Cl. ...................... 428/447; 525/431

(58) Field of Classification Search ............... 428/447; 525/431; 523/435, 451
See application file for complete search history.

(56) References Cited

U.S. PATENT DOCUMENTS

| | | | |
|---|---|---|---|
| 4,243,743 A | 1/1981 | Hiramoto et al. | |
| 4,937,133 A | 6/1990 | Watanabe et al. | |
| 5,326,792 A | 7/1994 | Masaki et al. | |
| 5,536,620 A | 7/1996 | Dueber et al. | |
| 5,643,657 A | 7/1997 | Dueber et al. | |
| 5,728,505 A | 3/1998 | Dueber et al. | |
| 5,747,625 A | 5/1998 | Furukawa et al. | |
| 5,859,181 A | 1/1999 | Zhao et al. | |
| 5,916,688 A | 6/1999 | Tokuhisa et al. | |
| 5,935,372 A * | 8/1999 | Rojstaczer et al. | 156/329 |
| 5,942,592 A | 8/1999 | Zhao et al. | |
| 6,015,510 A * | 1/2000 | Jacobson et al. | 252/609 |
| 6,117,510 A * | 9/2000 | Ishikawa et al. | 428/41.7 |
| 6,218,074 B1 | 4/2001 | Dueber et al. | |
| 6,274,662 B1 * | 8/2001 | Lynch et al. | 524/423 |
| 6,329,050 B1 * | 12/2001 | Yoshioka et al. | 428/355 EP |
| 6,468,639 B2 * | 10/2002 | Ishikawa et al. | 428/209 |
| 6,538,093 B2 * | 3/2003 | Sugo et al. | 528/28 |
| 6,693,162 B2 * | 2/2004 | Tsuji et al. | 528/170 |

FOREIGN PATENT DOCUMENTS

| | | |
|---|---|---|
| EP | 0 604 038 A | 6/1994 |
| JP | 04-023879 | 1/1992 |
| JP | 10-212468 | 8/1998 |

OTHER PUBLICATIONS

Definitions of "plasticizer", Webster's Dictionary; Concise Oxford Dictionary.*
Database WPI, Section CH, Week 200332, Derwent Publications Ltd., London, GB; Class A21, AN 2003-336871, XP002358976 & JP 2003 055636 A (Shinetsu Chem Ind Co Ltd), Feb. 26, 2003, Abstract Only.
Database WPI, Section CH, Week 199429, Derwent Publication Ltd., London, GB; Class A21, AN 1994-239014, XP002358977 & JP 06 172716 A (Ube Ind Ltd), Jun. 21, 1994, Abstract Only.

* cited by examiner

*Primary Examiner*—Margaret G. Moore

(57) ABSTRACT

The low modulus polyimide adhesive compositions of the present invention contain a low modulus polyimidosiloxane polymer, a thermosetting substantially-non-halogenated epoxy (optionally including an epoxy catalyst), a plasticizer, an insoluble halogen-free flame-retardant filler, and optionally an adhesion promoter. The adhesive can be applied upon (or incorporated into) flexible circuits using a relatively low lamination temperature, generally no higher than 200, 190, 180, 175, 170, 165, 160, 155, or 150° C. The adhesive is generally resistant to unwanted curl even in cases where the adhesive polyimide and the base film polyimide have a coefficient of linear thermal expansions (measured between 50° C. and 250° C.) that differ by more than 10, 15, 20 25, or 30 ppm/° C.

11 Claims, No Drawings

POLYIMIDE BASED ADHESIVE COMPOSITIONS USEFUL IN FLEXIBLE CIRCUIT APPLICATIONS, AND COMPOSITIONS AND METHODS RELATING THERETO

BACKGROUND OF THE INVENTION (a) Field of the Invention

The present invention relates generally to substantially halogen-free (e.g., less than or equal to 500 weight parts halogen per million weight parts polyimide) polyimide based compositions useful as sheet adhesives, and/or coverlay compositions, in flexible printed-circuit board applications.

More specifically, the substantially halogen-free compositions of the present invention comprise at least: i. a low modulus polyimide derived from a dianhydride component and a diamine component where from 15 to 60 mole percent of the diamine component is a diamine having a polysiloxane moiety; ii. an epoxy (or a functional derivative of an epoxy) adjuvant; iii. a plasticizer; and iv. a flame-retardant filler.

In one embodiment of the present invention, the substantially halogen-free composition optionally comprises an adhesion promoter.

The compositions of the present invention can generally be applied to other substrates or materials at low lamination temperatures. These compositions can typically provide excellent heat resistance (including flame retardancy), flexibility, dimensional stability and resistance to curl.

(b) Description of the Related Art

Broadly speaking, coverlay films are used to protect circuits supported on flexible printed-circuit boards. Conventional coverlay films are often prepared by coating one surface of a base film, such as a polyimide film, with an adhesive, such as an acrylic adhesive or an epoxy adhesive.

Conventional coverlay films can be problematic, because the epoxy (or acrylic portion) of the coverlay composition will oftentimes diminish the heat resistance and/or other useful properties of the film. In addition, epoxies containing bromine are commonly used for good flame-retardance, however current industrial applications are now favoring the use of substantially halogen-free flexible circuit materials.

SUMMARY OF THE INVENTION

The present invention is directed towards low modulus polyimide-based adhesive compositions that can generally be applied upon (or incorporated into) flexible circuits using a relatively low lamination temperature, generally no higher than 200, 190, 180, 175, 170, 165, 160, 155, or 150° C., depending upon the particular embodiment chosen in the practice of the present invention.

The polyimide-based adhesive compositions of the present invention are generally able to withstand a continuous operating temperature of at least 150, 145, 140, 135, 130, 125, or 120° C., and are generally resistant to unwanted curl when incorporated into (or upon) a flexible circuit. This is generally true even in cases where the adhesive polyimide, and the base film polyimide, have a coefficient of linear thermal expansions (measured between 50° C. and 250° C.) that differ by more than 10, 15, 20, 25, or 30 ppm/° C.

The polyimide-based adhesive compositions of the present invention comprise at least:
 i. a low modulus polysiloxane-based polyimide;
 ii. a thermosetting, non-brominated, epoxy optionally including an epoxy catalyst;
 iii. a plasticizer;
 iv. an insoluble flame-retardant filler; and
 v. optionally, an adhesion promoter.

DETAILED DESCRIPTION OF THE PREFERRED EMBODIMENTS

Coverlay Overview

Coverlay compositions, in accordance with the present invention, generally comprise both a base film (e.g. a pure polyimide) and a polyimide-based adhesive coating. The coating is typically on the inner side of the base film ("inner side" is intended to be the side intended ultimately to be applied adjacent to or otherwise closest to the circuit traces of a flexible printed circuit board).

The coverlay compositions of the present invention are generally applied to a surface of a flexible printed-circuit board (having an otherwise exposed circuit) and then laminated thereto using heat and pressure. The coverlay composition's base film will be discussed immediately below followed by a detailed discussion of the coverlay's polyimide-based adhesive composition and properties.

Coverlay 'Base Film'

A flexible printed circuit coverlay composition in accordance with the present invention comprises a polyimide 'base film'. In one embodiment of the present invention, the coverlay base film has a (relatively low) linear thermal expansion coefficient that is similar to the linear thermal expansion coefficient of an electrically conductive circuit (typically, a copper trace). In such an embodiment, the polyimide base film has a high modulus and a linear thermal expansion coefficient less than 15, 17, 19, 20, 22, 24, 26, 28, 30, 32, 34 or 36 ppm/° C. (at a temperature of 50° C. to 250° C.).

Examples of preferred polyimide base films include KAPTON HN and E films of E. I. duPont de Nemours & Co., UPILEX-S and UPILEX-SGA (produced by Ube Industries, Ltd. of Japan), APIKAL-NPI (produced by Kanegafuchi Chemical Industry Co., Ltd. of Japan), and NOVAX (produced by Mitsubishi Chemical Industries Ltd. of Japan).

The polyimide base film's modulus is generally greater than 400, 500, 600, 700, 750, 800, 950, 900, 950 or 1000 kPSI and a thickness of between 2 and 50 microns.

Optionally, the polyimide base film's inner surface can be treated to improve adhesion capabilities. Some examples of such treatments (for improving adhering property) include but are not limited to: (i.) mechanical roughening of the surface via brushing or sandblasting; and (ii.) chemical treatment, such as an alkali treatment, a corona treatment and/or a plasma treatment. Plasma treatments are generally preferable due to a relatively high efficiency in improving adhesion properties.

A plasma treatment may be carried out either continuously or batch-wise. From the viewpoint of efficiency, a continuous process is desirable. Some examples of the gas to be used for the plasma treatment include oxygen, nitrogen, helium, argon or $CF_4$. These gases may be used individually or as a mixture of two or more kinds of gases. The pressure of the plasma treatment is preferably from 0.08 to 0.15 torr, and the plasma power density (throwing electric power/area of electrode) is preferably from 0.2 to 100

W/cm², more preferably from 0.5 to 50 W/cm². The period of the plasma treatment is preferably from 10 seconds to 30 minutes or more, and it depends on other conditions.

Coverlay Polyimide-based Adhesive Compositions

A polyimide base film's inner surface can be coated with the polyimide-based adhesives of the present invention. On the other hand, the polyimide-based adhesives of the present invention can be used as a 'stand-alone' film, commonly called a 'bond-film', or if a bond film is placed on two sides of another substrate (typically a polyimide) the films of the present invention are used as a 'bond-ply'.

When used as a coverlay, bond-ply, or bond-film, the polyimide-based adhesives of the present invention can have a modulus less than or equal to 300, 250, 200 or 150 kPSI ("kPSI" is intended to mean a thousand pounds per square inch) as a stand alone film (i.e., when the polyamic acid-base composition is converted to polyimide film prior to lamination to a PCB).

A polyimide solution used for the adhesive composition can be generated by thermally imidizing the polyamic acid to polyimide prior to the addition of other adhesive ingredients, provided that a soluble polyimide formulation is employed.

In one embodiment of the present invention, the cured adhesive has a Z-axis thermal expansion coefficient (obtained from PVT data and from TMA data) of between and including any two of the following numbers 1000, 1500, and 2000 ppm/° C. (at temperatures of 50° C. to 200° C.).

The drying of the polyimide-based adhesive can be conducted by employing a drying oven having a full-float system that largely prevents contact between the applied coating and the conveyer devices. The applied thickness can be adjusted, so after drying, the final adhesive layer thickness is in a range between and including any of the following: 0.2, 0.3, 0.4, 0.5, 0.6, 0.7, 0.8. 0.9, 1.0, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9, 3.0 mils thick. When the thickness of the adhesive layer is less than that of the circuit trace, it can be difficult to sufficiently encapsulate the circuit trace in the adhesive layer (during lamination bonding with heat and pressure). Generally, the adhesive thickness is close to the minimum needed to encapsulate the circuit traces as thinner circuits are desired from cost, space and performance considerations.

In another embodiment, the polyimide-based adhesive is coated and dried upon a releasable film or metal surface, and the adhesive layer is then laminated between flexible printed circuit layers. In such an embodiment, the adhesive can be cast onto a releasable film such as polypropylene-treated release paper, metal foil, casting drum, or metal belt. Casting, in general, can be performed at room temperature using a doctor blade, spin coating, extrusion die, or other suitable means. A solution of about 10 to about 40 weight percent solids is generally satisfactory for casting such a film. In such an embodiment, the polyimide coating is heated to a temperature high enough to drive up the adhesive layer's solids content. In this manner, the polyimide-based adhesive can be stripped from the releasable film (and or metal surface) and physically handled without damage. If a higher bake temperature is needed than a release paper is stable to, the polyimide adhesive can be removed and laminated to Teflon PFA film for high temperature solvent removal.

In one embodiment, a second releasable film can be placed over the polyimide-based adhesive film after drying if desired.

Depending on the solvent used, solvent can usually be evaporated by heating at about 80° C. to about 200° C. This is done largely to completely remove the solvent. In such an embodiment, the polyimide-based adhesive film is generally about 25-microns (1 mil) to about 75-microns (3 mils) thick.

The resulting polyimide-based adhesive film (with the releasable film adhering to it) can then be rolled up for later use or a second releasable film can be placed over the exposed side of the polyimide adhesive before the coverlay is rolled up. To use as a coverlay component, it is unrolled (if it was previously rolled), and the releasable film is removed. Then, the exposed polyimide adhesive is placed against the substrate to which it is to be bonded. The polyimide-based sheet adhesive can then be pressed between two substrates or against one substrate with a releasable film on an opposite substrate.

Adherence of the polyimide-based adhesive to a polyimide base film, or a flexible circuit substrate, can often be accomplished through a lamination step performed at about 150° C. to about 200° C. with a pressure of up to about 70 to about 3450 kPa (or about 10 to 500 psi). Lamination is typically accomplished for example by passing the polyimide adhesive and substrate through a heated roller or preferably a hot press. The polyimide coating mechanically and chemically protects the substrate from the environment. Solvent remaining in the polyimide film can be removed by a slow post-baking step at a temperature that exceeds the boiling point of the solvent, typically, at 100° C. to 250° C. for about an hour.

Depending upon the embodiment of the present invention selected, the quantity of residual volatile matter remaining within the adhesive layers after drying should be low enough so that blisters do not occur during solder exposure of the flexible circuits. Larger quantities of residual volatile matter are generally undesirable because of voids or peeling of the interface between the coverlay and the flexible printed circuit board forming during soldering operations.

The polyimide-based adhesives of the present invention comprise at least:

i. a low modulus polyimide derived from a dianhydride component and a diamine component where from between any two of the following numbers, 15, 20, 25, 30, 35, 40, 45, 50, 55 to 60 mole percent of the diamine component are diamines having a polysiloxane moiety;

ii. a substantially halogen-free thermosetting epoxy, optionally including an epoxy catalyst;

iii. a plasticizer;

iv. an insoluble flame-retardant filler;

v. and optionally an adhesion promoter.

Each of the polyimide-based adhesive components will be addressed separately, as follows.

Polyimidosiloxane-portion of the Polyimide-Based Adhesive

"Polyimidosiloxane-portion" as used herein is intended to mean a polyimide derived a dianhydride component (or the corresponding diacid-diester, acid halide ester derivative, or tetra-carboxylic acid derivative of the dianhydride) and a diamine component wherein from between any two of the following numbers, 15, 20, 25, 30, 35, 40, 45, 50, 55 to 60 mole percent of the diamine component contains a polysiloxane moiety (i.e. a polysiloxane-containing diamine).

For example, polysiloxane-containing diamines useful in the present invention have the general formula:

$NH_2-R_1-O-[SiR'R''-O-]_m-R_1-NH_2$ where R' and R" are —(CH$_3$) or (C$_6$H$_5$), and where R$_1$ is —(CH$_2$)—$_n$ where n=1 to 10, preferably n=3, and m is 1 to 200, but is preferably 1 to 12 and more preferably 8-10. (Siloxane diamines are herein denoted by the notation "G$_m$", where "m" is the number of repeat-siloxane functional groups).

In the embodiments of the present invention, the polyimidosiloxane-portion of the polyimide-based adhesive composition is made from about 15 to about 60 weight percent polysiloxane-containing diamines and about 40 to about 85 weight percent diamines that do not contain a polysiloxane moiety.

For example, one useful polysiloxane-containing diamine is poly(dimethylsiloxane), bis(3-aminopropyl) terminated (herein referred to simply as "polysiloxane diamine").

Polysiloxane diamine has the structure of the formula below,

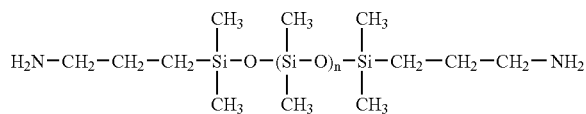

where n is equal to from 1 to 40, or from 5 to 20, or from 9 to 10.

In one embodiment of the present invention, an amount of polysiloxane diamine useful in the diamine component portion of the polyimide-base adhesive composition ranges from 15 to 60 mole percent (as a percentage of the total diamine component). In another embodiment of the present invention, the polyimidosiloxane of the polyimide-based adhesive preferably comprises between any two of the following numbers, 20, 25, 30, 35, 40 and 45 mole percent polysiloxane diamine and in yet another embodiment, from 30 to 35 mole percent polysiloxane diamine is possible.

Applicants have found that certain non-polysiloxane containing diamines are useful. For example, 2,2-bis-[4-(4-aminophenoxy)phenyl]propane (BAPP) and 3,3'-dihydroxy-4,4'-diaminobiphenyl (HAB) are diamines that may be used in conjunction with the polysiloxane diamine mentioned above.

If one uses BAPP diamine for example, it was found that from about 20 to 80 mole percent (of the total diamine component) is useful. In another embodiment, it was found that about 30 to 65 mole percent BAPP diamine is useful.

If HAB diamine is used as a part of the total diamine component, it was found that about one to 20 mole percent is useful. In another embodiment, about 2 to 15 mole-percent HAB diamine was found to be useful. In yet another embodiment, about 5 to 10 mole-percent HAB diamine was found to be useful.

In the embodiments of the present invention, the polyimidosiloxane-portion comprises at least 40, 45, 50, 55, 60, 65, to 70 weight percent of the total polyimide-based adhesive composition (including all of the polymers and other components present in the polyimide-based adhesive composition).

Moreover, the glass transition temperature of the polyimide-based adhesive is no higher than 200, 190, 180, 175, 170, 165, 160, 155, or 150° C.

Depending upon the embodiment selected, any one of a number of diamines can be useful in the practice of this invention (i.e. those diamines making up the remainder of the total diamine component, not including the polysiloxane-containing diamine). These useful diamines include monocyclic aromatic diamines and multi-cyclic aromatic diamines (particularly multi-cyclic aromatic diamines capable of creating a meta-bond along a backbone chain) such as:

1. 3,5-diaminobenzoic acid
2. 3,3'-diaminodiphenyl sulfone (3,3'-DDS);
3. 4,4'-diaminodiphenyl sulfone;
4. 1,3-bis-(4-aminophenoxy)benzene (APB-134);
5. 1,3-bis-(3-aminophenoxy)benzene (APB-133);
6. 1,4-bis-(4-aminophenoxy)benzene;
7. 1,4-bis-(3-aminophenoxy)benzene;
8. 2,2-Bis[4-(4-aminophenoxy)phenyl]-hexafluoropropane;
9. 2,2-bis(3-aminophenyl) 1,1,1,3,3,3-hexafluoropropane;
10. 4,4'-isopropylidenedianiline;
11. 1-(4-aminophenoxy)-3-(3-aminophenoxy)benzene;
12. 1-(4-aminophenoxy)-4-(3-aminophenoxy)benzene;
13. bis-[4-(4-aminophenoxy)phenyl]sulfone (BAPS);
14. 2,2-bis[4-(3-aminophenoxy)phenyl]sulfone (m-BAPS);
15. bis(4-[4-aminophenoxy]phenyl)ether (BAPE);
16. 2,2'-bis-(4-aminophenyl)-hexafluoropropane (6F diamine);
17. 2,2'-bis-(4-phenoxy aniline)isopropylidene;
18. and the like.

Generally, the relative stoichiometric quantity of dianhydride to diamine for the polyimide portion of the polyimide-based adhesive, needed to obtain a high enough molecular weight polymer, is in the range of 0.95 to 1.05.

Useful dianhydrides for synthesizing the polyimidosiloxane-portion of the polyimide-based adhesives in accordance with the present invention include:

1. 3,3',4,4'-biphenyl tetracarboxylic dianhydride (BPDA);
2. pyromellitic dianhydride (PMDA);
3. 3,3',4,4'-benzophenone tetracarboxylic dianhydride (BTDA);
4. 4,4'-oxydiphthalic anhydride (ODPA);
5. 3,3',4,4'-diphenylsulfone tetracarboxylic dianhydride (DSDA);
6. 4,4'-(4,4'-isopropylidenediphenoxy)bis(phthalic anhydride) (BPADA);
7. 2,2-bis(3,4-dicarboxyphenyl)propane dianhydride;
8. 4,4'-(hexafluoroisopropylidene)diphthalic anhydride (6FDA);
9. bis(3,4-dicarboxyphenyl)sulfoxide dianhydride;
10. polysiloxane-containing dianhydride;
11. and the like.

In one embodiment, useful dianhydrides include BPADA, ODPA, BPDA, BTDA, 6FDA, and PMDA or mixtures thereof, as these dianhydrides are readily commercially available and generally provide acceptable performance. One noteworthy dianhydride is BPADA, because it gives a polyimide-based adhesive having excellent adhesion and good flexibility with low moisture absorption and flatness.

Epoxy-Portion of Polyimide-Based Adhesive

In the embodiments of the present invention, an epoxy resin is intermixed with a polyimide solution. The epoxy resin can contain one, two, or three epoxy groups and can be aliphatic or aromatic. Aromatic epoxy resins are preferred as they generally have better mechanical properties when used as a component in either a film or adhesive layer.

The epoxy-portion is preferably either a liquid or a solid aromatic-epoxy resin having about 100 to 1000 epoxy equivalents and also having a molecular weight of about 300 to 5000. Examples of such epoxies include bisphenol A-type or bisphenol F-type epoxy resins (Epikote® 806, Epikote® 825, etc. produced by Yuka Shell Co.). Other useful epoxies include aromatic epoxy resins having three or more functional groups (e.g. DEN 438-EK85 produced by Dow, Epikote® 152, Epikote® 154, Epikote® 180 series, Epikote 157® series, Epikote® 1032 series produced by Yuka Shell Co. and MT0163 produced by Ciba-Geigy Co.).

Generally, the epoxy resins of the present invention have part-per-million (ppm) level quantities of chlorine remaining from the synthesis of the resin. Such low levels of halogen are not considered, in the present invention, to be sufficient to negate these epoxies from being considered "halogen-free" for purposes herein. Further, if desired, although potentially unfavorably economically, these resins can be further purified to reduce residual chlorine to substantially lower levels.

In one embodiment of the present invention, an amount of the epoxy resin to be used in the polyimide-based adhesive is no greater than 50 parts by weight. Preferably the amount of epoxy is between one and 50 parts by weight, and more preferably 10 to 40 parts by weight per 100 parts of the total amorphous polyimidosiloxane component.

Higher amounts of epoxy resin used herein may result in the following adverse conditions: (i.) gelation of the adhesive composition, (ii.) lower heat resistance of the adhesive which, when in contact with the heat of bonding the coverlay and metal layer together, the heat thermally degrades the adhesive, (iii.) reduction in the flowability of the adhesive as well as the flexibility of the adhesive layer in a PCB board, and (iv.) difficulty in achieving flatness of the flexible PCB.

If less than 1 part epoxy resin per 100 parts polyimidosiloxane is used, generally the adhesion and solvent resistance of the adhesive are lowered to such an extent to make the adhesive useless in the applications useful for this invention.

Additives, such as hydrazides and imidazoles, may also be used in conjunction with the epoxy resin to promote curing of the epoxy resin.

The epoxy can be incorporated into the polyimide-based adhesive by dissolving the epoxy into the adhesive coating solution prior to casting (or spinning).

Plasticizer-Portion of the Polyimide-Based Adhesive

In the embodiments of the present invention, the polyimide-based adhesive composition also comprises a compatible physical plasticizer (i.e. any kind of rheology modifier) to modify adhesion, flexibility, hardness, solubility, and other mechanical and chemical properties of the final adhesive during processing and/or end-use.

In one embodiment, the plasticizer-portion is an organic phosphate, such as, triphenyl and tricresyl phosphate. These plasticizers tend to depress the overall Tg of the polyimide-base adhesive, improve flame retardance, and helps to produce both a flat and flexible coverlay coating.

In such an embodiment, it has been found that the amount of compatible high boiling point physical plasticizer to be used in the polyimide-based adhesive composition should be from about 5 weight percent to about 40 weight percent of the total dry adhesive (i.e. when all the solvent and/or volatiles are removed). Preferably, from about 15 weight percent to about 35 weight percent is used.

In other embodiments of the present invention, useful plasticizers as the organic phosphate include (note: these plasticizers may not yield as good a flame resistance in the final adhesive) include:

i. phthalate esters, such as, dibutyl, dicyclohexyl, dioctyl and diphenyl phthalates, ii. aryl sulfonamides, such as, the N-(lower alkyl)benzenesulfonamides and N-(lower alkyl)toluenesulfonamides, iii. adipates, such as, dioctyl adipate and diisodecyl adipate and similar compatible esters, and iv. aromatic ether-ketone compounds and oligomers.

Other useful plasticizers include dibutyl phthalate, di-n-octyl phthalate, etc., phosphates such as tributyl phosphate tricresyl phosphate, etc.; and benzoates such as benzyl benzoate, ethylene glycol dibenzoate, etc.

The plasticizer is incorporated into the polyimide-based adhesive by dissolving the plasticizer into the polyimide-based adhesive coating solution prior to casting (or spinning) and curing of the polyimide-based adhesive.

Flame-Retardant Filler Portion of the Polyimide-Based Adhesive

In the embodiments of the present invention, an organic filler is incorporated into the polyimide-based adhesive composition to improve the flame-retardance of the material. Useful flame-retardant fillers include, but are not limited to, melamine polyphosphate, melamine pyrophosphate, or the like. Melamine polyphosphate is preferable for the adhesives of the present invention that are subjected to high temperature solder conditions. Melamine pyrophosphate is also a useful flame-retardant additive but, at temperatures above 300° C., the loss of water from this material can cause blisters to form in a flexible circuit laminate.

Other useful flame-retardant fillers of the present invention include, but are not limited to, the following substances:

1) ammonium polyphosphate,
2) polyphosphoric acid amide,
3) ammonium polyphosphoric acid amide,
4) melamine polyphosphate (Melapur200®),
5) melamine polyphosphate acid,
6) melamine-modified ammonium polyphosphate,
7) melamine-modified polyphosphoric acid amide,
8) melamine-modified ammonium polyphosphate,
9) melamine-modified ammonium polyphosphoric acid amide,
10) melamine-modified carbamyl polyphosphate,
11) carbamyl polyphosphate,
12) phosphoric acid-urea-dicyanamide-melamine reaction product,
13) phosphoric anhydride-urea-melamine-ammonium bicarbonate reaction product,
14) phosphoric anhydride-urea-melamine-ammonium bicarbonate-dicyanamide reaction product,
15) mixtures of aluminum salts of diethylphosphinate and melamine polyphosphate, (Exolit OP 1311® and OP 1312® produced by Clariant Inc.), and
16) combinations of two or more of the above.

According to the present invention, the amount of the flame-retardant filler to be used in the polyimide-based adhesive is from 1, 3, 5, 8, 10, 15, 20, 25, 30, 35, 40, 45 to 50 parts by weight, preferably 2, 4, 6, 8, 10, 15, 20, 25, 30, 35, 40, 45, 50, 55, 60, 65, 70, 75, 80, 85, 90, 95 to 100 parts by weight and more preferably 10, 15, 20, 25 to 30 parts by weight per 100 parts weight of the aforementioned polyimidosiloxane of the polyimide-based adhesive.

In one embodiment of the present invention, the flame-retardant additive is dispersed (and if necessary ground to a smaller particle size) in a compatible solvent then physically mixed with the polyimide-based adhesive coating solution prior to casting (or spinning).

Optional Adhesion Promoters

About 0.5, 1, 2, 3, 4, to about 5 weight percent (based on total weight of the monomers used to form the polyimide adhesive) of a coupling agent can be useful to promote adhesion of the polyimide-based adhesive to metals and to help crosslink the epoxy resin. Examples of suitable adhesion promoters (coupling agents) include:
a. 3-MT (structure is provided below),
b. 5-ATT (5-amino-1,3,4-thiadiazole-2-thiol; structure is provided below),
c. 2-MB (2-mercaptobenzimidazole; structure is provided below),
d. Norbloc® 7966 (a benzotriazole with methacrylate functionality),
e. polybenzimidazole (CAS# 25734-65-0).

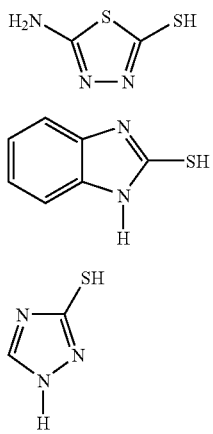

Other useful coupling agents, depending upon the embodiment chosen in the practice of this invention, include:
a. N-(triethoxysilylpropyl)urea,
b. 3-glycidoxypropyltrimethoxysilane,
c. 3-methacryloxypropyltrimethoxysilane,
d. N-2-aminoethyl-3-aminopropyltrimethoxysilane,
e. and the like.

Generally, the adhesion promoter can be incorporated into the polyimide-based adhesive by dissolving the promoter into the polyimide-based adhesive coating solution prior to casting (or spinning).

Preparation of the Polyimide-Based Adhesive

The preparation of the polyimidosiloxane is generally carried out by reacting substantially equimolar quantities of the above-described aromatic diamines and the above-described dianhydrides in a solvent, such as N-methylpyrrolidinone (NMP), N,N-dimethylformamide (DMF), N,N-dimethylacetamide (DMAc), dimethylsulfoxide (DMSO), 1,4-dioxane, gamma-butyrolactone, and tetrahydrofuran at a temperature ranging from 20° to 40° C. Other useful organic polar solvent for the aforementioned polyimidosiloxane include 1,3-dimethyl-2-imidazolidinone and N-methylcaprolactam, sulfur atom-containing solvents such as diethylsulfoxide, dimethylsulfone, diethylsulfone and hexamethylsulforamide, hexamethylphosphoramide, phenolic solvents such as cresol, phenol and xylenol, glyme-type solvents such as diethyleneglycol dimethyl ether (diglyme), triethyleneglycol dimethyl ether (triglyme) and tetraglyme and mixtures of these solvents. The solvents useful in the present invention preferably have a boiling point between 130° C. and 210° C. Lower boiling point solvents may evaporate too readily from the coated adhesive and higher boiling solvents may be too difficult to remove by heat.

In one embodiment of the present invention, a polyamic acid precursor is prepared using a mixture of diamines (those diamines that both contain and do not contain a polysiloxane moiety), a dianhydride, or mixture of dianhydride and a suitable solvent. In another embodiment, these components will form a soluble polyimidosiloxane.

The polyimidosiloxane-portion is then homogeneously mixed with the other required components (e.g. the epoxy component, the plasticizer, and the flame-retardant filler) to form the polyimide-based adhesive coating solution. This solution is referred to generally as the polyimide-based adhesive coating solution.

The polyimide-based adhesive coating solution can be about 10, 15, 20, 25, 30, 35 to about 40 weight percent solids. In some embodiments, about 25 to about 35 weight-percent solids is useful as more dilute solutions result in more solvent needing to be evaporated. Higher concentration solutions can be overly viscous, depending on the molecular weight of the polyimide.

In one embodiment, the polyimidosiloxane-portion can be made from reacting of one or more of the following dianhydrides, ODPA, BPADA, BPDA, and BTDA with BAPP diamine, polysiloxane diamine ($G_9$ or $G_{10}$) and HAB in NMP solvent. The reaction that forms the polyamic acid can be carried out at about room temperature.

In another embodiment, the polyimidosiloxane portion is substantially imidized, which generally means that about 95 to 100% of the initially formed polyamic acid groups are imidized. Imidization is generally done in a solvent in which the imidized polyimide is also soluble. Imidization can be accomplished by heating at about 150° C. to 180° C. The amount of imidization that occurs can be determined by infrared spectrum analysis, or by acid titration. The amount of heating and time necessary to achieve full imidization will depend on the particular monomers used to prepare the polyamic acid.

The polyimidosiloxane portion of the polyimide-based adhesive may be obtained by polymerizing, in an organic solvent, one or more dianhydrides with one or more aromatic diamines that contain a benzene ring having at least one functional group such as an —OH group or —COOH group. These functional groups can then react with the epoxy-portion of the adhesive composition. The resultant polyamic acid is then imidized by heat and/or imidization chemicals. Thermal imidization is preferable to chemical imidization so that the required precipitation step, to remove the polyimide from the chemical imidization chemicals, can be avoided.

In one embodiment, the diamine component of the polyimidosiloxane portion of the polyimide-based adhesive preferably contains 1, 2, 4, 6, 8, 10, 12, 14, 16, 18 to 20 mole percent, particularly, 2, 4, 6, 8, 10, 12, to 15 mole percent and especially 5, 6, 7, 8, 9 to 10 mole percent (of total moles diamine) of an aromatic diamine having a functional group such as —OH or —COOH (which can react with an epoxy group), 15, 20, 25, 30, 35, 40, 45, 50, 55, to 60 mole-percent, particularly 20, 25, 30, 35, 40 to 45 mole percent, and especially 25–35 mole percent polysiloxane diamine, and 20, 30, 40, 50, 60, 70 to 80 mole-percent, particularly 25, 30, 35, 40, 45, 50, 55, 60, 65, 70 to 75 mole percent, and especially 30, 35, 40, 45, 50, 55, 60 to 65 mole percent non-siloxane containing aromatic diamine. When the proportions of the components are outside of these ranges, some desired properties may be impaired, such as, flatness, adhesion, heat resistance (including solder heat resistance) and solubility.

The polyimide-based adhesive coating solution may be obtained, for example, by reacting the aromatic dianhydride component with the diamine components in different orders. The aromatic dianhydride component can be first polymerized with the polysiloxane diamine in an organic polar solvent or solvent system at 15–35° C. followed sequentially with one or more other diamine additions. The polyamic acid solution can then be heated at 150 to 200° C. to obtain a block-type polyimidosiloxane.

In an alternative embodiment, a polyimidosiloxane can be obtained by first polymerizing the aromatic dianhydride components and diamine components in approximately equimolar amounts in an organic polar solvent at 15–35° C. to obtain a polyamic acid, and then imidizing it.

If necessary, aromatic hydrocarbon solvents such as toluene and xylene or other organic solvents such as solvent naphtha and benzonitrile may also be used in combination therewith. Alternatively, if the polyamic acid is substantially converted to a polyimide in solution, the polyimide solution can be precipitated in a non-solvent for the polyimidosiloxane so that the polyimide can be collected by filtration. The polyimidosiloxane may be dissolved in an organic solvent of the same or a different type than the organic solvent used for the polymerization.

In the present invention, the polyimidosiloxane portion may be obtained by any of the aforementioned processes. In one embodiment of the present invention, a process producing as high a molecular weight polymer as possible can be used (i.e., a "high" imidization efficiency process). A process such as this can dissolve, in organic polar solvents, the components at a high concentration, at least 10 weight percent, preferably from 15 to 60 weight percent, and especially about 25 to 50 weight percent. In one embodiment of the present invention, the polyimidosiloxane portion preferably is imidized to at least 90% or greater, and particularly 95% or greater.

In one embodiment of the present invention, polyimide-based adhesive solution is obtained by adding prescribed amounts of the aforementioned amorphous polyimidosiloxane, epoxy resin, flame-retardant filler and adhesion promoter, to an organic solvent and uniformly stirring and mixing the components. The mixing may be performed in a suitable amount of an organic solvent to make a solution composition.

The polyimide-based adhesive coating solution may be used directly, or the solution may be further diluted with an appropriate amount of organic solvent.

The polyimide-based adhesives of the present invention may be used individually or as a blend of two or more other polymers in a solvent. While the polyimide-based adhesive is being dried, by heating to form an adhesive layer, the heating can also drive an imidization reaction if complete conversion to polyimide was not fully obtained before application of the adhesive.

The polyimide-based adhesive can generally be modified by the selection of monomers to adjust the glass transition temperature of the polyimidosiloxane portion.

The polyimide-based adhesive compositions of the present invention, as a film or as a coated layer, generally have a thickness of about 25-microns or 20, 18, 16, 14, 12, 10, 8, 6, 4, or 2 microns.

In one embodiment of the present invention, the polyimide-based adhesive composition is subjected to heat and pressure to bond the adhesive formulation into a laminate structure. The bonding is generally carried out at a temperature sufficient for flowing of the adhesive to encapsulate the printed circuit. The pressure is not particularly limited, but it is generally useful not to use lower than 10, 20, or 40 kg/cm$^2$ (generally approximately 140 to 570 psi).

The time necessary to bond and cure the adhesive is not particularly limited so long as a secure adhesive film or adhesive layer bonded to another substrate or material is obtained through sufficient thermosetting of the epoxy and curing of the polyimidosiloxane. In one embodiment, preferable times for bonding (and curing) by heat and pressure is 15 to 90 minutes.

Flexible Printed Circuit Boards

The term "coverlay" is used herein to describe a substantially permanent coating layer of the polyimide-based adhesives of the present invention on polyimide base film having bonded to it metal circuit traces. A coverlay is generally used to protect printed circuits during subsequent processing, primarily solder operations, and/or from environmental effects during use.

Permanent coatings also are used as intermediate insulator layers, with or without photo-development functionality, in the manufacture of multilayer printed circuits.

In practice, a coverlay is a layer typically between 15 and 50 micrometers (0.6 and 2 mils) thick. A coverlay is typically "pre-punched" (or "pre-drilled") to provide holes (i.e., called vias), and is bonded to a printed circuit substrate (typically is a printed circuit relief pattern on a substrate that is, in most cases, semi-rigid or flexible). Connecting leads of electrical components are then inserted into the through-holes or positioned on surface mount areas and soldered in place to form the packaged electrical component.

Typically, the flexible printed-circuit board used in the present invention is not particularly limited so long as it comprises at least one flexible base, which has at least one surface bearing a circuit. A typical example of the preferred flexible printed-circuit board is a flexible printed-circuit board having no adhesive layer or a flexible printed-circuit board having at least one adhesive layer therein.

A flexible printed-circuit board having no adhesive layer may be produced by making at least one circuit on the copper foil-bearing surface of a copper foil/polyimide film laminate, or copper foil/polyimide film/copper foil laminate. A flexible printed-circuit board having at least one adhesive layer may be produced by making at least one circuit on the copper foil-bearing surface of a copper foil/adhesive/polyimide film laminate, namely a copper-clad polyimide film having an adhesive layer, or on both the copper foil-bearing surfaces of a copper foil/adhesive/polyimide film/adhesive/copper foil laminate, namely a double-sided copper-clad polyimide film.

The copper-clad polyimide film having at least one adhesive layer may be produced by bonding a copper foil to at least one surface of a polyimide film through an adhesive.

In the present invention, bonding by heat and pressure is generally done at temperatures between 150° C. to 180° C. These temperatures are typical lamination temperatures of acrylic and/or epoxy adhesives that were generally used in the conventional, three-layer flexible printed-circuit boards.

An example of the copper foil/polyimide film/copper foil laminate, namely the copper-clad polyimide film having substantially no adhesive layer, is produced by E. I. duPont de Nemours and Co., called Pyralux AP8525.

An example of the copper foil/adhesive/polyimide film laminate, namely the copper-clad polyimide film having an adhesive layer, is FR0111 by E. I. duPont de Nemours and Co.

Prior to the bonding of the coverlay, it is generally desirable to subject the circuit to a treatment to improve adhere-ability. Such treatments include a copper-brown oxide treatment (cuprous oxide), a black-oxide treatment (cupric oxide), or treatment with a coupling agent.

Coverlay films according to the present invention are generally resistant to unwanted curl and generally provide excellent heat and flame resistance. A combined use of such coverlay films and two-layer metal-polyimide flexible substrates makes it possible to produce heat resistant flexible printed circuit boards covered with a coverlay.

The Base Polyimide Film and the Coverlay (Adhesive) Combined

In accordance with the present invention, either side or both sides of a polyimide base film with metal circuitry (having a thickness of about 5–150 microns) can be coated (either simultaneously or in multiple stages) with the above-mentioned coverlay adhesive solution composition or the coverlay adhesive in the form of a film. Typically, the adhesive layer has a thickness of between, and including, any two of the following numbers, 5, 10, 15, 20, 25, 30, 35, 40, 45, 50, 55, 60, 65, 70 to 75 microns after drying (and curing). The base film and coverlay can then be subjected to a treatment, including heating to the required dryness, at a temperature which produces substantially no curing (crosslinking) of the epoxy resin. This temperature is preferably 80–100° C., followed by a short exposure time at 200° C. to remove any unwanted residual organic solvent. The result is a flat, tack-free adhesive layer with no surface defects.

When the adhesive layer is not tack-free, (e.g., because a residue of the solvent does remain in the adhesive layer), unwanted blistering can occur after lamination to the flexible printed circuit and/or exposure to high soldering temperatures.

In one embodiment of the present invention, the adhesive layer has a tensile modulus (at 25° C.) of 10–150 kg/mm$^2$ and a mechanical elongation of 10–80% as measured with a 50 micron thick film prepared by heating and drying the composition at 80° C. for 60 minutes. According to this invention, a releasable protective film may be placed over the adhesive layer side to prevent blocking with the base film upon winding, or to generally preserve the adhesive strength of the adhesive layer.

Generally, any resin film with satisfactory surface smoothness, and good release from the coated adhesive can be used as a protective film. Polyester film for example may be used. The thickness of the protective film is typically from any between any two of the following numbers, 5, 10, 15, 20 to 25 microns.

Permanent Coating Evaluation

Printed circuits must withstand a variety of tests that are dependent on the application of the circuits. The tests, in turn, govern the type of materials used in the construction as the circuit substrate. A more stringent application is flexible printed circuits that require a fold or bend in order to meet a particular space requirement (e.g. camera or video-cassette recorders (VCR)). Other even more stringent applications may require the PCB to survive multiple bends, such as in a computer disc drive. In some rigid-flex circuit applications, a flexible circuit is combined with a rigid circuit to form a flex-rigid multilayer printed circuit. The end use tests for flexible circuits in general focuses on adhesion of the circuit package (between all the layers) and the capability of the package to withstand a single fold or multiple fold bends. The process to prepare these materials, and several tests that are used to support these requirements, is explained in the EXAMPLES section below.

The adhesives of the present invention are useful as component layers buried within a printed circuit board, or may be useful as coverlay compositions on top of a printed circuit board. These circuit boards can be particularly useful in a wide-range of electronic devices, including but not limited to, digital cameras, video recorders, digital video recorders, cellular phones, computers, data storage devices, IC packaging and the like.

Encapsulation

This test evaluates the capability of coverlay to adequately protect the substrate. The substrate chosen for this test should represent that used in end-use applications. The substrate is typically a circuit pattern and is processed with the coverlay exactly as is done in actual manufacturing. After processing, the sample is evaluated using 10× magnification for any air entrapment that constitutes a failure. In addition, the sample also may be cross-sectioned along the edge of a circuit line and evaluated using magnification to ensure that the photoimageable coverlay adequately covers the area with no defects. Before samples are subsequently processed, the material should pass the encapsulation test.

Molecular Weight Determination

Molecular weights were obtained by size exclusion chromatography using THF as the eluting solvent and using polystyrene standards.

Bend & Crease

The substrate to be used for this test is typically a MIT flexural endurance pattern. The MIT pattern is a meander pattern that has alternating one-mm lines and spaces in the region of the testing.

Flammability (UL94VTM Test)

Specimens were tested in accordance with the UL 94 Thin Material Vertical Burning Test for classing resist coating materials as 94VTM-0, 94VTM-1 or 94VTM-2. The 94VTM-0 classification is the best rating, indicating significantly reduced flammability.

EXAMPLES

The advantages of the present invention are illustrated in the following examples. These examples are not intended to limit the scope of this invention. The following non-limiting examples are designed to further illustrate the claimed invention. The compositions below are described in weight-percent for each ingredient used. The following glossary below contains a list of names and abbreviations for ingredient used:

BAPP 2,2-bis(4-[4-aminophenoxy]phenyl)-propane from Wakayama Seika Kogyo Co. LTD BPDA Biphenyldianhydride DEN 438-EK85 Epoxy resin from Dow, 86.1% solids in methyl ethyl ketone; trace amounts of chlorine present from synthesis DMAC N,N-dimethylacetamide 2-ethyl-4-methylimidazole Epoxy catalyst from Aldrich Chemical Co.

G9 Bis(3-aminopropyl)polydimethylsiloxane, with 9 repeat dimethylsiloxane groups from PCR, Inc.

G10 Bis(3-aminopropyl)polydimethylsiloxane, with 10 repeat dimethylsiloxane groups from G. E. Silicones HAB 3,3'-dihydroxy-4,4'-diaminobiphenyl from Wakayama Seika Kogyo Co. Ltd.

Lindol® XP Plus Tricresyl phosphate from Azko Nobel Chemicals

Melapur® 200 dispersion 19.66% solids dispersion of melamine polyphosphate flame-retardant from DSM Melapur in methyl ethyl ketone.

2-MB 2-mercaptobenzimidazole from Aldrich Chemical Co.

NMP 1-methyl-2-pyrrolidinone

BPADA Bisphenol A dianhydride from GE

Example 1

This example illustrates the use of a substantially halogen free coverlay composition using a dispersion of melamine polyphosphate as the flame-retardant filler.

A dispersion of Melapur® 200 was prepared having a mean particle size of 1.9 micrometers from a starting material having a mean particle size of 18.7 micrometers. A slurry of 4 kg Melapur® 200 of 16 kg of methyl ethyl ketone was milled in a Zeta mill with 0.6 to 0.8 mm fused zirconia silica grinding media, an agitator speed of 2,000 RPM, and the temperature controlled below 31° C. The dispersion was 19.66% solids.

A polyimide was prepared by first preparing the polyamic acid and thermally imidizing the polyamic acid to polyimide. The polyamic acid was prepared by the procedure: A solution of 455 grams of dry DMAC, and 122.135 grams of BPADA was stirred at 24° C. in a round bottom flask under nitrogen as 65.01 grams of G9 polysiloxane diamine was pumped in slowly over 45 min. with the temperature reaching 29° C. 2.57 grams of HAB were added 5 min. 57.22 grams of BAPP were added in parts over 57 min. with the reaction temperature reaching 35° C. After 2 hrs. stirring, the solution was filtered through a 25-micron filter to yield 628 grams of filtered solution. 282 grams of this solution was heated to 150° C. for 16 hrs to give a 35% solids polyimide solution with viscosity of 2,080 centipoise, weight average molecular weight of 34,300, and number average molecular weight of 19,900. The composition of the polyimide is Ultem DA (100)//BAPP (60)/G-9 (33)/HAB (5) on a molar basis.

The coating composition was prepared of:

| Ingredient | Grams |
| --- | --- |
| Polyimide solution | 32.000 |
| DEN 438-EK85 | 2.390 |
| Melapur ® 200 dispersion | 10.472 |
| Lindol ® XP Plus | 5.147 |
| 2-ethyl-4-methylimidazole | 0.082 |
| 2-MB | 0.041 |

The coating solution was passed through a 25-micron filter and was coated on 1 mil Kapton® film with a 6 mil doctor knife. The wet coating was baked at 80° C. for 15 min. and then at 200° C. for 10 min. to yield a 1.3 to 1.4 mil thick adhesive. The flat coverlay was punched for flow tests and the coverlay laminated on a Carver press at 180° C. for 30 min. at 200 psi to a substrate. The lamination stack is a caul plate, 3.5 mm thick 3-ply heat resistant silicone rubber, 3 sheets of autoclave paper, the coverlay sample, MIT pattern, 3 sheets of autoclave paper, coverlay sample, Nikaflex® 9110 laminate, 3 sheets autoclave paper, 5-mil Teflon® PFA, coverlay, 3 sheets autoclave paper, 3.5 mm thick 3-ply heat resistant silicone rubber, caul plate. To provide multiple samples for testing, additional sheets of coverlay can be laminated in the stack with 3 sheets of autoclave paper between laminates to be made. Laminates made, Pyralux® AP8525, showed good encapsulation without entrapped air or voids. Laminates of coverlay to Nikaflex® 9110 laminate were cut into 0.5-inch wide strips and the peel strength was measured to be 2.7 pli to the shiny side of the copper substrate. Samples were baked 1 hr at 135° C. and solder float tested at 288° C. for 30 sec and found to have 3.8 pli peel strength. Coverlay that was hole-punched prior to lamination had <5% flow of adhesive on the copper substrate. Flame testing using the UL94VTM-0 test of coverlay that was cured between 2 pieces of Teflon® PFA film showed that the first and second burn tests gave <1 sec burn per sample so the coverlay is 94VTM-0 rated.

Example 2

This example illustrates the use of a substantially halogen free coverlay composition using a dispersion of melamine polyphosphate as the flame-retardant filler.

A dispersion of melamine pyrophosphate was prepared according to the method described in Example 1 to yield a 17.5% solids dispersion in N,N-dimethylacetamide having a mean particle size of 2.0 micrometers.

A polyimide was prepared as in Example 1 by first preparing the polyamic acid and thermally imidizing the polyamic acid.

The polyamic acid was prepared by the procedure: A solution of 245.0 grams of dry 1-methyl-2-pyrrolidinone (NMP), 245.1 grams of 2-methoxyethyl ether (diglyme) and 103.85 grams of BPADA was stirred at 23° C. in a round bottom flask under nitrogen as 58.83 grams of G9 polysiloxane diamine was pumped in slowly over 60 min. with the temperature reaching 27° C. 2.17 grams of HAB was added over 5 min. 47.31 grams of BAPP were added in parts over 1 hr 15 min. with the reaction temperature reaching 29° C. The polyamic acid solution was stirred 16 hours without heating. 605 grams of polyamic acid solution was obtained. 200.15 grams of this solution was heated to 152° C. for 3 hrs and 10 min. to yield 189.19 grams of 30% solids polyimide solution with viscosity of 1,120 centi-poise, weight average molecular weight of 33,000, and number average molecular weight of 20,000. The composition of the polyimide is Ultem DA (100)//BAPP (57.9)/G-9 (35.1)/HAB (5) on a molar basis.

The coating composition was prepared of:

| Ingredient | Grams |
| --- | --- |
| Polyimide solution | 30.000 |
| DEN 438-EK85 | 1.160 |
| Melamine pyrophosphate dispersion | 10.056 |
| Lindol ® XP Plus | 6.129 |
| 2-ethyl-4-methylimidazole | 0.072 |

The coating solution was passed through a 25-micron filter and was coated on 1 mil Kapton® film with a 6 mil doctor knife. The wet coating was baked at 80° C. for 15 min. and then at 200° C. for 10 min. to yield a 1.25-mil thick adhesive. The flat coverlay was punched for some tests and laminated as in Example 1 on a Carver press at 180° C. for 30 min. at 200 psi to chemically cleaned substrates. Laminates made to MIT meander patterns on Pyralux® AP8525 showed good encapsulation without entrapped air or voids. Five inch long by five-inch wide samples of coverlay laminated to Nikaflex® 9110 were flat after the press lamination. Laminates of coverlay to Nikaflex® 9110 laminate were cut into 0.5 inch wide strips and the peel strength was measured to be 4.4 pli to the shiny side copper substrate.

Samples were baked 1 hr at 135° C. and solder float tested at 288° C. for 30 sec and found to have 4.3 pli peel strength. Coverlay that was hole punched prior to lamination had <5% flow of adhesive on the copper substrate. Flame testing using the UL94VTM-0 test of coverlay that was cured between 2 pieces of Teflon® PFA film showed that the first and second burn tests gave 1 sec burn each time per sample so the coverlay is 94VTM-0 rated.

Example 3

This example illustrates the use of a substantially halogen free sheet adhesive composition.

A polyimide was prepared by first preparing the polyamic acid and thermally imidizing the polyamic acid to polyimide as in Example 1. The polyamic acid was prepared by the procedure: A solution of 270.5 grams of dry 1-methyl-2-pyrrolidinone (NMP), 270.02 grams of 2-methoxyethyl ether (diglyme) and 41.08 grams of BPADA was stirred at 23° C. in a round bottom flask under nitrogen as 60.01 grams of G10 polysiloxane diamine was pumped in slowly over 60 min. with the temperature reaching 29° C. 61.24 grams of BPADA were added, followed by 2.22 grams of HAB was added over 5 min. 48.30 grams of BAPP was added in parts over 1 hr 15 min. with the reaction temperature reaching 32° C. by the end of the addition and reaching 37° C. after 40 min. continued stirring. After 65 min. continued stirring, the solution was filtered through a 25-micron filter to yield 703 grams of filtered solution. 200 grams of this solution and 40.3 grams of xylenes was placed in a round bottom flask with nitrogen bleed, condenser and Dean Stark trap, which contained 19.21 grams of xylenes. This solution was heated to reflux at 162° C. for 1 hr 25 min, collecting 1.8 ml water. 170 grams of a 35% solids polyimide solution was obtained with viscosity of 4,400 centipoise, weight average molecular weight of 60,200, and number average molecular weight of 29,000.

The composition of the polyimide is Ultem DA (100)//BAPP (60)/G-9 (33)/HAB (5) on a molar basis.

| Ingredient | Grams |
| --- | --- |
| Polyimide solution | 32.000 |
| DEN 438-EK85 | 2.993 |
| Melapur ® 200 dispersion | 9.920 |
| Lindol ® XP Plus | 3.657 |
| 2-ethyl-4-methylimidazole | 0.078 |
| 2-MB | 0.039 |

The coating solution was passed through a 25-micron filter and was coated on the paper side of release paper with a 6-mil doctor knife. The wet coating was baked at 80° C. for 15 min. and delaminated from the paper and placed on 5-mil thick Teflon® film to give a no tack, flat coating of 1.0 to 1.2 mil thickness. The flat sheet adhesive was punched for some tests and laminated as in Example 1 on a Carver press at 180° C. for 30 min. at 200 psi to chemically cleaned substrates. Laminates made with the adhesive between 1 mil Kapton® film and MIT meander patterns on Pyralux® AP8525 showed good encapsulation without entrapped air or voids and the flexible circuits samples were flat even with the sheet adhesive laminated with 1 mil Kapton® film to just one side of the circuit. Laminates of sheet adhesive to Nikaflex® 9110 laminate were cut into 0.5 inch wide strips and the peel strength was measured to be 3.2 pli to the shiny side copper substrate. Samples were baked 1 hr at 135° C. and solder float tested at 288° C. for 30 sec and found to have 3.1 pli peel strength. Sheet adhesive that was hole punched prior to lamination between Kapton® film and the copper side of Nikaflex®9110 had approximately 5% flow of adhesive on the copper substrate. UL94VTM-0 flame testing was done on samples of the sheet adhesive that was cured between two pieces of 5-mil Teflon® PFA film and delaminated after cure for testing of the free standing cured adhesive. The first and second burn tests gave only 1 to 2 sec burn per sample so the sheet adhesive is 94VTM-0 rated.

Comparative Example 1

The comparative example illustrates the poor performance obtained when no plasticizer is used in the formulation. The same polyimide solution and the same melamine polyphosphate flame-retardant dispersion was used here as was used in EXAMPLE 1.

The coating composition was prepared of:

| Ingredient | Grams |
| --- | --- |
| Polyimide solution | 20.000 |
| DEN 438-EK85 | 1.493 |
| Melapur ® 200 dispersion | 6.256 |
| 2-ethyl-4-methylimidazole | 0.051 |
| 2-MB | 0.026 |

The coating solution was passed through a 25-micron filter and was coated on release paper with a 6-mil doctor knife. The wet coating was baked at 80° C. for 15 min. Attempts to remove the coating from the release paper caused the brittle coating to crack so no additional testing was possible.

Comparative Example 2

This comparative example illustrates a flame-retardant adhesive without the use of non-halogenated flame-retardant filler, but this required the use of brominated epoxy. The polyimide was prepared by the method of Example 1 of composition BPDA (100 mole %) and BAPP (77.7 mole %), G-9 (22.2 mole %). After thermal imidization, the polyimide solution was precipitated in methanol, the solid polyimide collected by filtration, dried and dissolved in tetrahydrofuran to give 19.5% solids solution. The polyimide composition is BPDA (100)//BAPP (77.7)/G-9 (22.2) on a molar basis.

The coating composition was prepared of:

| Ingredient | Grams |
| --- | --- |
| Polyimide solution | 35.000 |
| Brominated bisphenol A Diglycidyl ether (48 weight percent bromine) | 1.101 |
| DEN 438-EK85 | 0.648 |
| Tricresyl phosphate | 2.532 |

The coating solution was coated on 1 mil thick Kapton® film with a 5-mil doctor knife. The wet coating was baked at 80° C. for 8 min. to yield coating of 0.8 to 1.0 mil thickness. Samples were laminated as in Example 1 against 5-mil thick Teflon® PFA on a Carver press at 160° C. for 60 min. at 200 psi. Flame testing of the cured coverlay using the UL94VTM-0 test showed that the first and second burn tests gave one second burn each time per sample so the coverlay is UL94VTM-0 rated. 5×5 inch samples of the cured coverlay were not totally flat.

What is claimed is:

1. A multilayer substrate comprising:
   A. an adhesive layer having:
      i. 100 weight parts polyimidosiloxane component;
      ii. a polymer adjuvant comprising a plurality of epoxy moieties or derivatives of epoxy moieties, being present in a weight part amount within a range between and including the following weight part quantities per 100 parts by weight of the polyimidosiloxane component: and 50, and the polymer adjuvant comprising less than or equal to 500 ppm halogen;
      iii. a plasticizer, being present in a weight part amount within a range between and including the following weight part quantities per 100 parts by weight of the polyimidosiloxane component: 5, and 80, and
      iv. a halogen-free flame-retardant filler in an amount of 2–100 parts by weight per 100 parts by weight of the polyimidosiloxane component, and
   B. a polyimide base film having an inner side that is in contact with the adhesive layer, the polyimide base film and the adhesive layer each having a coefficient of thermal expansion, wherein the difference in coefficient of thermal expansion between the base film and the substrate is greater than or equal to 5 ppm/° C. (measured between 50° C. and 250° C.), and said base film having a modulus greater than 400 kPSI.

2. A multilayer substrate in accordance with claim 1, wherein the polyimidosiloxane polymer is a polyimide derived from a dianhydride component and a diamine component, and wherein from 15 to 60 mole percent of the diamine component is a polysiloxane diamine.

3. A multilayer substrate in accordance with claim 1, wherein the adhesive layer has:
   i. a modulus less than or equal to 300 kPSI,
   ii. a z-axis thermal expansion coefficient of being in a range between and including the following 1000 and 2000 ppm/° C. (at a temperature of 50° C. to 200° C.), and
   iii. a thickness in a range between and including the following thicknesses (in mils): 0.2 and 30.

4. A multilayer substrate in accordance with claim 1, the flame-retardant filler selected from one or more of a group consisting of melamine polyphosphate and melamine pyrophosphate.

5. A multilayer substrate in accordance with claim 1, the adhesive layer further comprising an adhesion promoter.

6. A multilayer substrate in accordance with claim 5, the adhesion promoter being present in an amount of 0.5 to 5 weight percent (based on total weight of the substrate), wherein the adhesion promoter is selected from one or more of a group consisting of:
   a. 3-MT,
   b. 5-ATT (5-amino-1,3,4-thiadiazole-2-thiol),
   c. 2-MB (2-mercaptobenzimidazole),
   d. benzotriazole,
   e. polybenzimidazole,
   f. N-(triethoxysilylpropyl) urea,
   g. 3-glycidoxypropyltrimethoxysilane,
   h. 3-methacryloxypropyltrimethoxysilane, and
   i. N-2-aminoethyl-3-aminopropyltrimethoxysilane.

7. A multilayer substrate in accordance with claim 2, wherein the diamine component is derived from diamine monomers wherein from between the following numbers 1 and 20 mole percent of the diamine monomers have at least one functional group selected from the group consisting of —OH or —COOH.

8. A multilayer substrate in accordance with claim 1, wherein the polymer adjuvant is derived from an epoxy catalyst and an epoxy resin providing 100–1000 epoxy equivalent weight and a weight average molecular weight of about 300–5000 end further derived from 1 to 10 mole % of the diamine in the polyimidosiloxane containing phenolic functionality.

9. A multilayer substrate in accordance with claim 1, wherein the plasticizer is an organic phosphate in a dry weight percentage amount from 15 to 35 percent.

10. A printed circuit board comprising a multilayer substrate of claim 1.

11. An electronic device comprising a printed circuit board in accordance with claim 10.

* * * * *

UNITED STATES PATENT AND TRADEMARK OFFICE
CERTIFICATE OF CORRECTION

PATENT NO.         : 7,220,490 B2
APPLICATION NO. : 10/892863
DATED              : May 22, 2007
INVENTOR(S)        : Brian C. Auman et al.

It is certified that error appears in the above-identified patent and that said Letters Patent is hereby corrected as shown below:

Column 4, line 57: "a polyimide derived a dianhydride" should read -- a polyimide derived from a dianhydride --

Claim 1, line 13: "component: and 50" should read -- component: 1 and 50 --

Claim 1, line 19: "component: 5, and 80" should read -- component: 5 and 80 --

Claim 3, line 44: "0.2 and 30" should read -- 0.2 and 3.0 --

Claim 8, line 32: "300-5000 end" should read -- 300-500 and --

Signed and Sealed this

Third Day of July, 2007

JON W. DUDAS
*Director of the United States Patent and Trademark Office*